United States Patent
Wu et al.

(10) Patent No.: US 9,450,120 B2
(45) Date of Patent: Sep. 20, 2016

(54) METHOD OF INCREASING THE BAND GAP OF IRON PYRITE BY ALLOYING WITH OXYGEN

(71) Applicant: THE REGENTS OF THE UNIVERSITY OF CALIFORNIA, Oakland, CA (US)

(72) Inventors: Ruqian Wu, Irvine, CA (US); Matt Law, Irvine, CA (US); Jun Hu, Irvine, CA (US); Yanning Zhang, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 353 days.

(21) Appl. No.: 13/799,632

(22) Filed: Mar. 13, 2013

(65) Prior Publication Data
US 2014/0096814 A1    Apr. 10, 2014

Related U.S. Application Data

(60) Provisional application No. 61/677,994, filed on Jul. 31, 2012.

(51) Int. Cl.
*H01L 31/032*    (2006.01)
*H01L 31/072*    (2012.01)

(52) U.S. Cl.
CPC ........... *H01L 31/032* (2013.01); *H01L 31/072* (2013.01); *Y02E 10/50* (2013.01)

(58) Field of Classification Search
CPC ............... H01L 31/00; H01L 31/0248; H01L 31/0256; C01B 17/62
See application file for complete search history.

(56) References Cited

PUBLICATIONS

Han et al. ("Earth-Abundant Iron Oxysulfide (FeSxOy) for Bandgap Optimization"); PVSC held on Jun. 3-8, 2012; published in the 38th 2012 IEEE.*
Hu et al. ("First-principles studies of the electronic properties of native and substitutional anionic defects in bulk iron pyrite"); Physical Review B 85, 085203 (Feb. 13, 2012).*
Hu, J., et al., "Increasing the Band Gap of Iron Pyrite by Alloying with Oxygen", J. Am. Chem. Soc., 2012, vol. 134, pp. 13216-13219.

* cited by examiner

*Primary Examiner* — Christina Chern
(74) *Attorney, Agent, or Firm* — One LLP (57) ABSTRACT

A method of increasing the band gap of iron pyrite by alloying with oxygen is disclosed. According to one embodiment, a method comprises alloying iron pyrite ($FeS_2$) with oxygen to form an iron pyrite and oxygen alloy ($FeS_{2-x}O_x$). The iron pyrite and oxygen alloy ($FeS_{2-x}O_x$) has a band gap greater than iron pyrite ($FeS_2$).

7 Claims, 9 Drawing Sheets

FIG. 8

METHOD OF INCREASING THE BAND GAP OF IRON PYRITE BY ALLOYING WITH OXYGEN

The present application claims the benefit of and priority to U.S. Provisional Application No. 61/677,994 titled "METHOD OF INCREASING THE BAND GAP OF IRON PYRITE BY ALLOYING WITH OXYGEN," filed on Jul. 31, 2012, which is hereby incorporated by reference in its entirety.

STATEMENT REGARDING FEDERALLY SPONSORED RESEARCH OR DEVELOPMENT

This invention was made with Government support under Grant No. CHE-1035218, awarded by the National Science Foundation. The Government has certain rights in this invention.

FIELD

This patent application relates in general to iron pyrite ($FeS_2$), and more specifically to iron pyrite ($FeS_2$) thin films for opto-electronic applications, including solar energy conversion devices, with appropriate band gap by alloying with oxygen, and methods for forming iron pyrite-oxygen alloy materials.

BACKGROUND

Iron pyrite ($FeS_2$) is a promising photovoltaic material because of its strong light absorption ($\alpha > 105$ cm$^{-1}$ for h$\nu$>1.3-1.4 eV), sufficient minority carrier diffusion length (100-1000 nm), and essentially infinite elemental abundance. Pyrite photoelectrochemical and solid-state Schottky solar cells have shown large short-circuit current densities (30-42 mA cm$^{-2}$) and quantum efficiencies (up to 90%). However, the band gap of pyrite ($E_g$=0.95 eV) is somewhat narrow for optimal photovoltaic applications according to the Schockly-Queisser theory and, more seriously, the open-circuit voltage of pyrite-based devices is too low (Voc≈0.2 eV, only ~20% of $E_g$). It should be easier to achieve a larger Voc by starting from a larger bulk band gap. Therefore, identifying practical ways to increase the band gap of pyrite is of interest for the development of pyrite-based photovoltaics.

Substituting cations or anions with isovalent elements or compensated dimers is a widely-used approach to modify the band gaps of other semiconductors, including III-Vs and ternary ABC$_2$ chalcopyrite compounds. A recent density functional theory (DFT) study by Sun et al. found that the band gap of pyrite can be increased slightly by replacing some Fe by Ru or Os to form $Fe_{1-x}Ru_xS_2$ and $Fe_{1-x}Os_xS_2$ compounds. However, this approach is limited by the overall weakness of the effect ($E_g$ increases by only ~0.1 eV even at x=0.5) and the low solubility of Ru and Os in pyrite.

Upon investigation of $Fe_{1-x}Zn_xS_2$ alloys, it was determined that substitutional zinc (ZnFe) results in significant band gap narrowing for x up to 0.5 (i.e., 50% ZnFe), in spite of the large band gap of pyrite ZnS$_2$ itself (~2.5 eV). The calculations on $Fe_{1-x}Zn_xS_2$ alloys are in good agreement with the results of Sun et al. Substitution of Zn for Fe produces gap states and new valence bands above the Fe-hg bands of pyrite, leading to a narrowed band gap at large $Zn_{Fe}$ concentrations. The unexpected ineffectiveness of cation alloying calls for a new approach to increase the band gap of iron pyrite.

Accordingly, improved methods for increasing the band gap of pyrite, thereby improving the overall band gap and open circuit voltage of pyrite-based devices are needed.

SUMMARY

Embodiments disclosed herein are directed to methods for increasing the band gap of iron pyrite by alloying with oxygen and to pyrite-based devices for photovoltaic applications comprising a pyrite-base photovoltaic material having a band gap that is greater than iron pyrite ($FeS_2$). According to one embodiment, a method comprises alloying iron pyrite ($FeS_2$) with oxygen to form an iron pyrite and oxygen alloy ($FeS_{2-x}O_x$). The iron pyrite and oxygen alloy ($FeS_{2-x}O_x$) has a band gap greater than iron pyrite ($FeS_2$).

The systems, methods, features and advantages of the invention will be or will become apparent to one with skill in the art upon examination of the following figures and detailed description. It is intended that all such additional methods, features and advantages be included within this description, be within the scope of the invention, and be protected by the accompanying claims. It is also intended that the invention is not limited to require the details of the example embodiments.

BRIEF DESCRIPTION

The accompanying drawings, which are included as part of the present specification, illustrate the presently preferred embodiment and, together with the general description given above and the detailed description of the preferred embodiment given below, serve to explain and teach the principles of the present invention.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not necessarily describe every aspect of the teachings disclosed herein and do not limit the scope of the claims.

DETAILED DESCRIPTION

A method of increasing the band gap of iron pyrite by alloying with oxygen is disclosed. According to one embodiment, a method comprises alloying iron pyrite ($FeS_2$) with oxygen to form an iron pyrite and oxygen alloy ($FeS_{2-x}O_x$). The iron pyrite and oxygen alloy ($FeS_{2-x}O_x$) has a band gap greater than iron pyrite ($FeS_2$).

The embodiments provided herein are directed to pyrite-based devices for photovoltaic applications comprising a pyrite-base photovoltaic material having a band gap that is greater than iron pyrite ($FeS_2$). The increase in band gap has been demonstrated through the use of systematic density function theory (DFT) studies and model analyses.

In accordance with the embodiments provided herein, the band gap of iron pyrite ($FeS_2$) is increased by replacing ~10% of the sulfur atoms with oxygen atoms. (i.e., ~10% $O_s$ (substitutional oxygen)) from ~1.0 eV to ~1.2 to 1.5 eV (depending on the spatial distribution of the $O_s$ centers). Substitutional oxygen $O_s$ formation is exothermic and oxygen atoms prefer a uniform distribution in the pyrite lattice. Oxygen atoms tend to avoid O-O dimerization, which favors the structural stability of homogeneous $FeS_{2-x}O_x$ alloys and frustrates phase separation into FeS2 and iron oxides. With an ideal band gap, absence of $O_s$-induced gap states, high optical absorptivity, and low electron effective mass, $FeS_{2-x}O_x$ alloys are promising for the development of pyrite-based heterojunction solar cells that feature large photo-voltages and high device efficiencies. The resulting $FeS_{2-x}O_x$ (x≈0.2) alloys are thermodynamically stable, retain the relatively small electron effective mass of pure pyrite, and show better light absorption than pyrite itself in the near-infrared region of the spectrum. Oxygen-alloyed pyrite may therefore be promising for fabricating pyrite solar cells with larger Voc values, provided that synthetic schemes can be developed that avoid the phase separation of iron oxides. Several methods, including reactive sputtering, can be used to synthesize these alloys.

To rationally increase the band gap of pyrite, it is important to understand the nature of the electronic states at its valance band maximum (VBM) and conduction band minimum (CBM).

Figure 1:
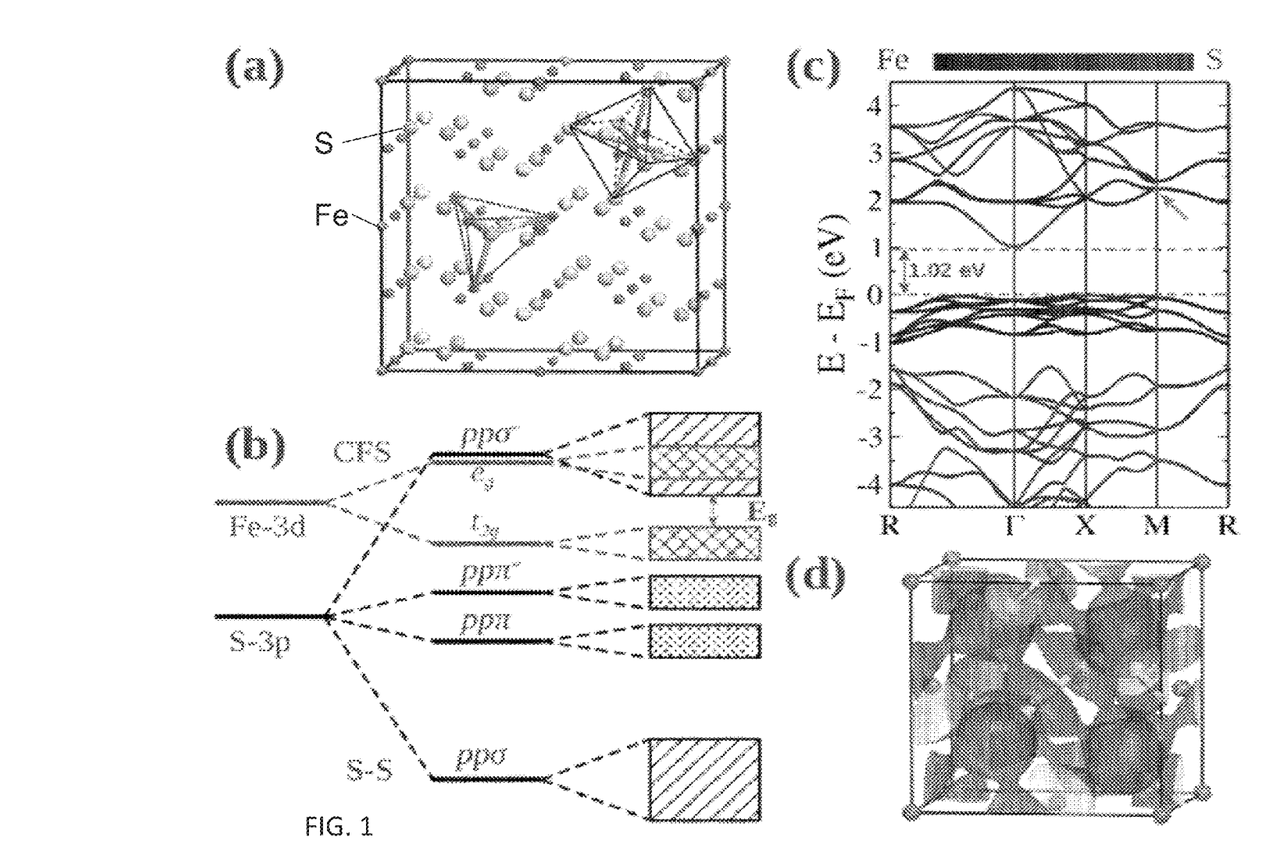
FIGS. 1A through 1D illustrate crystal structure and electronic properties of bulk iron pyrite.

FIGS. 1A-1D illustrate crystal structure and electronic properties of bulk iron pyrite. FIG. 1A illustrates a 2×2×2 super cell of bulk pyrite (96 atoms). The lighter and darker spheres denote S and Fe atoms, respectively. The local symmetry around the Fe and S atoms is indicated by the octahedron and tetrahedron. Pyrite adopts a NaCl-like structure (space group Pa3') as depicted in FIG. 1A, with a face-centered cubic sublattice of $Fe^{2+}$ cations and $S^{2-}_2$ dimers at the anion positions. FIG. 1B illustrates a sketch of the energy diagram for the Fe-3d and S-3p orbitals of bulk pyrite under the influences of crystal-field-splitting (CFS) and S—S dimerization. The 3d orbitals of Fe are split into $t_{2g}$ and $e_g$ groups in the approximately $O_h$ local symmetry, while 3p-orbitals of S are split into four groups in the C3v symmetry. The arrow denotes the band gap, $E_g$. Each Fe ion is coordinated to six S ions and each S ion locates at the center of a tetrahedron consisting of another S and three Fe atoms.

FIG. 1C illustrates the band structure of bulk pyrite with a scale indicating the contributions from Fe and S atoms. Atomic contributions are computed by projecting the Bloch wave functions of pyrite into atomic orbitals of Fe and S atoms. Note that the conduction band minimum (CBM) is almost completely contributed by sulfur ppσ* orbitals, as shown also in FIG. 1B. The horizontal dashed lines indicate the energy positions of the valence band maximum (VBM) and CBM. The arrow marks the degenerate Fe-$e_g$ levels that split with the presence of $O_s$, as also highlighted in FIG. 2. The valence bands originate almost completely from the Fe-$t_{2g}$ orbitals, showing little Fe—S hybridization within 1 eV of the VBM. In contrast, Fe-$e_g$ and S-ppσ* orbitals strongly hybridize in the conduction bands, as indicated by the rapid changes of Fe and S weights for bands around 3 eV above the VBM in FIG. 1C. It is important to note that the bottom of the S-ppσ* band extends about 1 eV below the Fe-$e_g$ bands, meaning that the CBM of pyrite is almost purely S-ppσ* in character (98%). This can be seen more clearly from the isosurfaces of the single-state charge density of the CBM in FIG. 1D, which appears as a network of S-ppσ* orbitals. FIG. 1D illustrates the single-state charge density of the CBM at 0.016 e/$Å^3$ for a conventional pyrite unit cell.

With this picture in mind, one may increase $E_g$ of pyrite by reducing the bandwidth of the S-ppσ* bands to lift the CBM toward the Fe-$e_g$ bands. One proposal to achieve this is to expand the unit cell by incorporating large isovalent cations such as Ru and Os. However, the strain effect on $E_g$ is very small, e.g., $E_g$ only increases by 0.1 eV with the concentration of Ru or Os as high as 50%. A more direct and effective approach is to reduce the average hopping integral within the S-ppσ* orbital network by replacing a fraction of the sulfur anions with smaller oxygen anions. Because oxygen 2p-orbitals have less spatial extent than sulfur 3p-orbitals, oxygen anions are expected to act as pinch points in the S-ppσ* network and so reduce its bandwidth, widening the pyrite band gap. The binding energy of oxygen on a sulfur site (Os) is ~0.16 eV larger than that of sulfur on a sulfur site (Ss), showing that oxygen should be readily incorporated into pyrite. This same work also demonstrated that Os impurities at a concentration of 1.6 at % increase $E_g$ slightly (by 0.04 eV) without producing electronic states within the band gap to act as traps or recombination centers.

Figure 2:
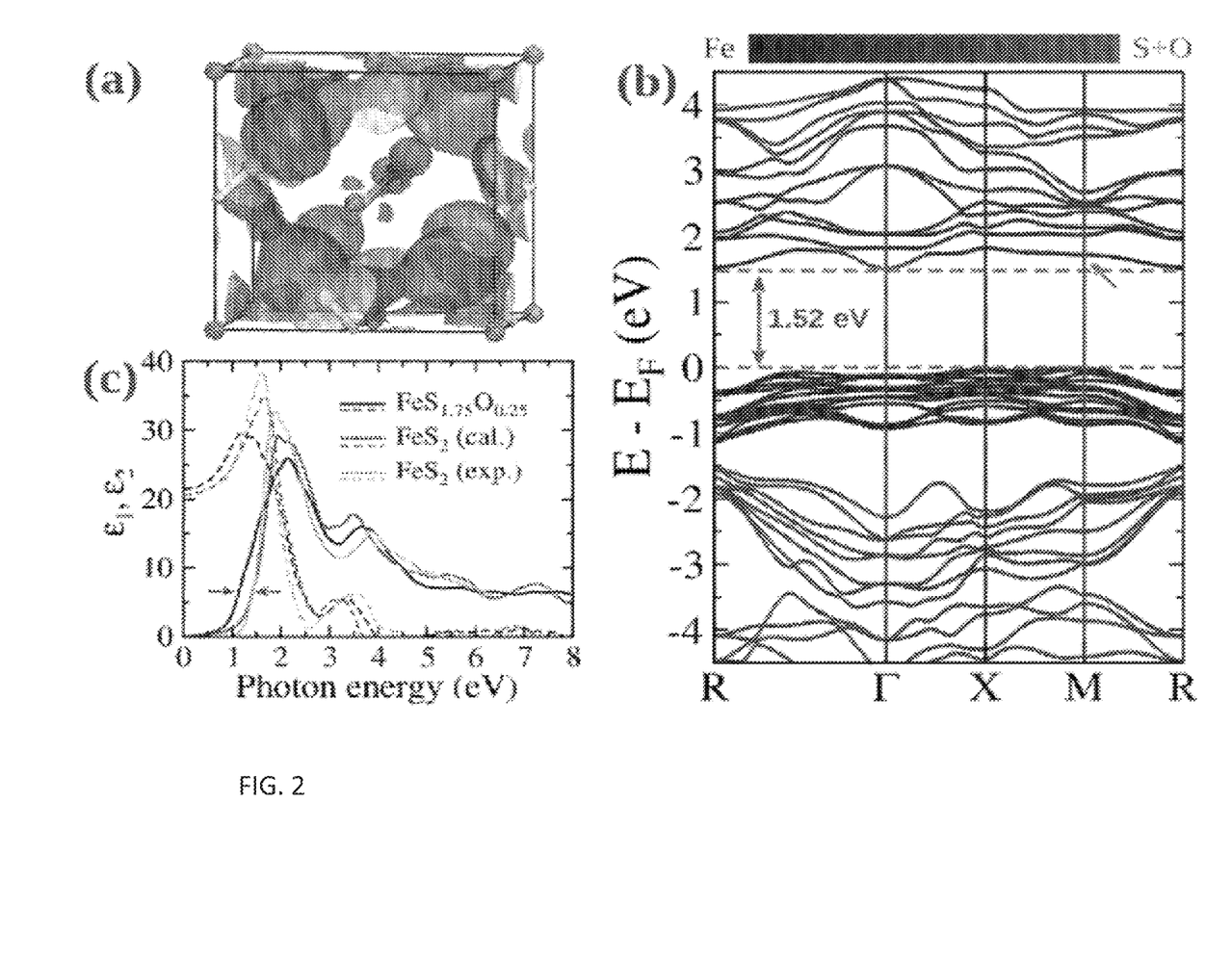
FIGS. 2A through 2C illustrate electronic and optical properties of $FeS_{1.75}O_{0.25}$ (12.5% Os), using the most ordered configuration.

DFT calculations were carried out with the Vienna ab initio simulation package (VASP) at the level of the generalized gradient approximation (GGA) using the Perdew-Burke-Ernzerhof (PBE) functional. The projector augmented wave (PAW) method was used for the description of the core-valence interaction. The energy cutoff for the basis expansion was set to 350 eV. The Hubbard U correction was added on Fe 3d electrons with U=2 eV. 2×2×2 supercells with 96 atoms were used for all calculations. The Brillouin zone (BZ) was sampled by 15×15×15 and 7×7×7 k-grid meshes for unit cell and supercell, respectively. All atoms were fully relaxed until the calculated force on each atom was smaller than 0.01 eV/A. For $FeS_{2-x}O_x$ alloys, Os impurities were randomly distributed in the supercell when x≤0.5, while only uniform distributions were considered for x=0.5 and 1.0. For concentrations with random distributions, $\Delta H_f$ and $E_g$ in FIG. 2 are averaged over all configurations except Configuration 11.

FIGS. 2A through 2C illustrate electronic and optical properties of $FeS_{1.75}O_{0.25}$ (12.5% Os), using the most ordered configuration.

To determine the effect of high $O_s$ concentrations on the band gap of pyrite, the most ordered possible structure of $FeS_{1.75}O_{0.25}$ is analyzed, using a $Fe_4S_7O$ conventional cubic unit cell with 12.5% $O_s$, as depicted in FIG. 2A. FIG. 2B shows the band structure of this hypothetical $FeS_{1.75}O_{0.25}$ alloy. Comparing to the band structure of bulk pyrite in FIG. 1C, it is evident that the CBM of the $FeS_{1.75}O_{0.25}$ alloy shifts upward toward the Fe-$e_g$ bands and the band gap increases to 1.52 eV without introducing gap states. This indicates that replacing sulfur with isovalent oxygen is indeed a more promising strategy than cation substitution for modifying the pyrite band gap. From the single-state electron density plot in FIG. 2A for the new CBM at the r point, we observe that the CBM still originates from the S-ppσ* states, but the continuous S-ppσ* network of pure pyrite is disrupted around the O—S dimer because $O_s$ has a more localized wave function and a different potential than the rest of the anion sublattice. These features of $O_s$ are ideal for reducing the S-ppσ* bandwidth and widening the pyrite band gap. The effective mass of carriers at the new CBM is $0.67m_e$ (compared to 0.44 $m_e$ for pure pyrite), so the high electron mobility of pyrite may be preserved. Meanwhile, the VBM shifts to the M point and the effective hole mass becomes 1.44 $m_e$, comparable to that of pure pyrite (1.23-1.98 $m_e$, depending on direction).

It is worth pointing out that the orbital overlap and hence the optical transitions between Fe-$t_{2g}$ states in the valance bands and S-ppσ* states in the conduction bands are negligible. Thus the optical absorption of pyrite originates mainly from electric dipole transitions between Fe-$t_{2g}$ and Fe-$e_g$ states, with the latter mixed with some S-p and Fe-p states to fulfill the selection rules. FIG. 2C illustrates calculated dielectric functions ($\in = \in_1 + i\in_2$) of $FeS_{1.75}O_{0.25}$ and bulk pyrite, accompanied with experimental data for bulk pyrite. Dashed and solid curves represent $\in_1$ and $\in_2$, respectively. Arrows highlight the downward shift of the absorption edge due to the oxygen alloying effect.

The calculated dielectric functions in FIG. 2C indicate that most of the optical absorption peaks of pyrite are not significantly affected by the upward shift of the S-ppσ* bands in $FeS_{1.75}O_{0.25}$. Interestingly, the presence of $O_s$ makes the optical absorption threshold shift downward by ~0.4 eV, as highlighted by the arrows in FIG. 2C. Therefore, $FeS_{2-x}O_x$ alloys are actually stronger light absorbers than pure pyrite, despite their larger band gaps. The reliability of this prediction is attested by the good agreement between the calculated dielectric functions and recent spectroscopic ellipsometry measurements on pyrite single crystals. Through analysis of momentum matrix elements, it is found that the optical absorption edge of both pyrite and $FeS_{1.75}O_{0.25}$ results mainly from electric dipole transitions between the highest Fe-$t_{2g}$ valence states and the lowest Fe-$e_g$ states around the M point. The enhanced optical absorption of $FeS_{1.75}O_{0.25}$ in the near-infrared region can be traced to the splitting of the four-fold degenerate Fe-$e_g$ bands that are marked by the arrows in FIG. 1C and FIG. 2B. Due to the reduction of local symmetry around Fe, the Fe-$e_g$ bands of pure pyrite split into two branches in $FeS_{1.75}O_{0.25}$ ~2.2 eV above $E_F$ at the M point, with one branch dropping by 0.4 eV. Therefore, the presence of high concentration $O_s$ in pyrite not only increases the band gap, but may also further enhance its overall optical absorptivity.

Figure 3:
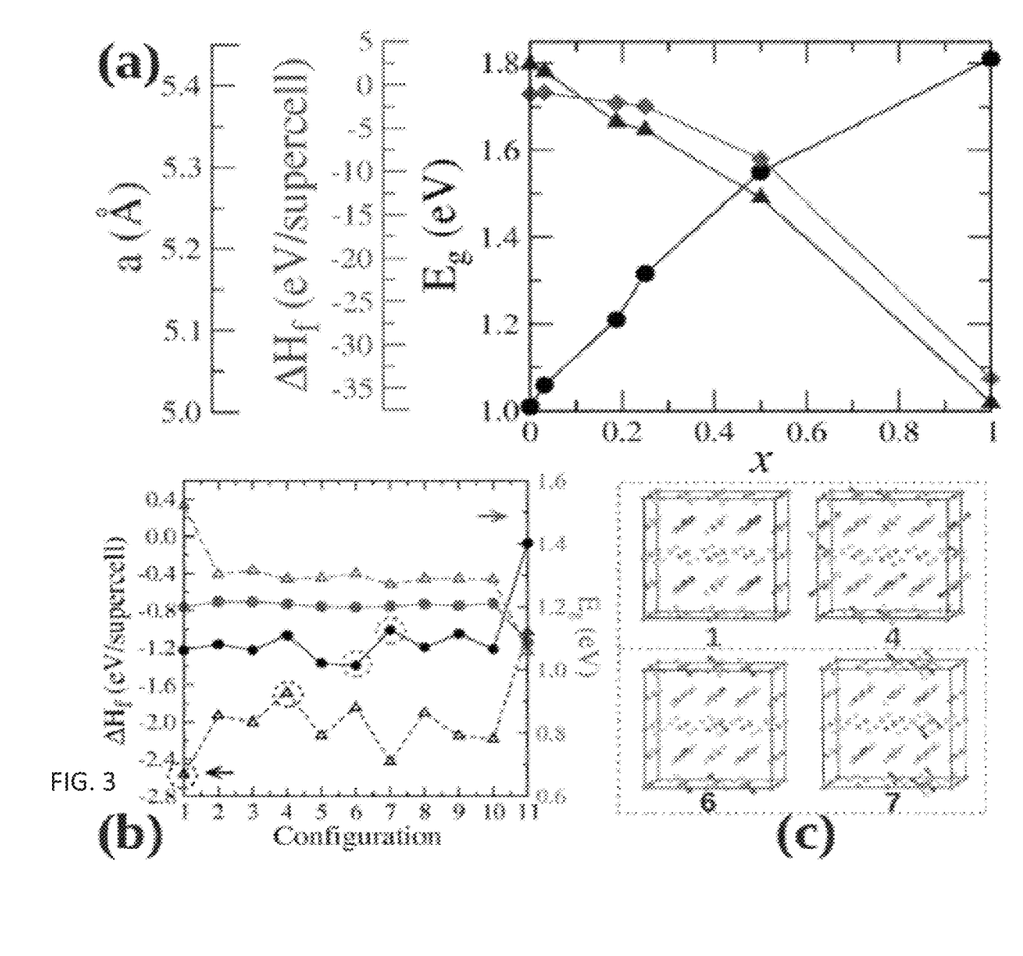
FIGS. 3A through 3C illustrate physical attributes and structural features of $FeS_{2-x}O_x$ alloys.

FIGS. 3A through 3C illustrate physical attributes and structural features of $FeS_{2-x}O_x$ alloys.

FIG. 3A illustrates lattice constant, formation enthalpy, and band gap as a function of x. Results of systematic studies of the effect of $O_s$ concentration on the band gap and other pertinent properties of $FeS_{2-x}O_x$ alloys with x up to 1.0 (50% $O_s$) using 2×2×2 supercells (96 atoms) are shown in FIG. 3A. The most striking finding is the strong monotonic increase of $E_g$ with increasing x, up to $E_g$=1.88 eV for x=1.0. The lattice constant decreases as x increases due to the smaller size of oxygen compared to sulfur. Meanwhile, the formation enthalpy [defined as the difference of total energies:

$$\Delta H_f = E(FeS_{2-x}O_x) - E(FeS_2) - \frac{x}{2}E(O_2) + \frac{x}{8}E(S_8)]$$

is more negative with increasing x, indicating that oxygen substitution in pyrite is energetically favorable (as expected). If iron oxide precipitation is considered at large oxygen loadings, incorporating oxygen into pyrite at concentrations above 15-20% is likely impractical.

FIG. 3B illustrates $\Delta H_f$ and $E_g$ of $FeS_{1.75}O_{0.25}$ (open triangles) and $FeS_{1.8125}O_{0.1875}$ (closed circles) calculated for various $O_s$ configurations. Configurations 1-10 contain only S—S and s-o dimers arranged in different patterns, while Configuration 11 contains one 0-0 dimer. Configuration 1 of the $FeS_{1.75}O_{0.25}$ alloy is equivalent to the evenly distributed $O_s$ case of FIG. 2A.

FIG. 3C illustrates selected atomic structures of $FeS_{1.75}O_{0.25}$ (upper panels) and $FeS_{1.8125}O_{0.1875}$ alloys (lower panels) with the lowest and highest enthalpies as indicated by the dashed circles in FIG. 3B for each stoichiometry. Numbers denote the corresponding structures in FIG. 3B.

Figure 4:
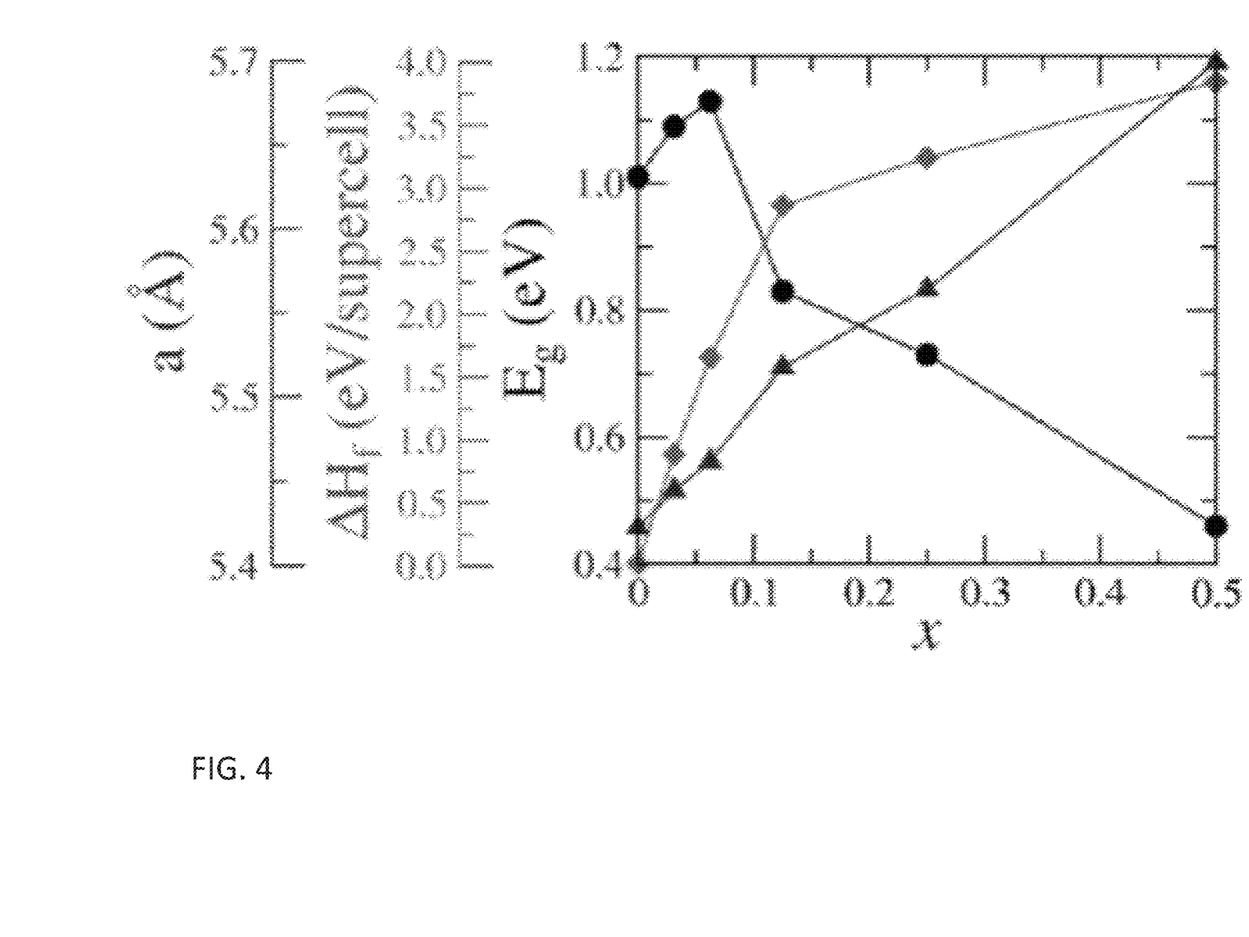
FIG. 4 illustrates lattice constant (a), formation enthalpy ($\Delta H_f$) and energy gap ($E_g$) of $Fe_{1-x}Zn_xS_2$ alloys.

FIG. 4 illustrates lattice constant (a), formation enthalpy ($\Delta H_f$) and energy gap ($E_g$) of $Fe_{1-x}Zn_xS_2$ alloys. To reveal the underlying mechanism of gap bowing in $Fe_{1-x}Zn_xS_2$ alloys at the smallest $E_g$ at x=0.5, 6 $Fe_{1-x}Zn_xS_2$ compositions were studied with x varying from 0 to 0.5. A 2×2×2 supercell was used for x=0.03 and 0.06, while a conventional unit cell was used for all other compositions. The atomic positions as well as the lattice constants are optimized. The results indicated Zn ions prefer to be separated in all cases; the energy cost of $Zn_{Fe}$ clustering is about 0.15 eV/Zn. Therefore, the focus turns to the results for the uniform $Zn_{Fe}$ distributions. As shown in FIG. 4, the lattice constant increases monotonically with higher $Zn_{Fe}$ concentration because Zn ions are larger than Fe ions. Meanwhile, the stability of $Fe_{1-x}Zn_xS_2$ alloys can be determined by the formation enthalpy that is defined as the difference of the total energies, $$\Delta H_f = E(Fe_{1-x}Zn_xS_2) - E(FeS_2) - xE(Zn) + xE(Fe) \qquad (1)$$

Here, $E(Fe_{1-x}Zn_xS_2)$ and $E(FeS_2)$ are total energies of $Fe_{1-x}Zn_xS_2$ alloy and bulk pyrite with the same supercell size, while E(Zn) and E(Fe) are chemical potentials of Zn and Fe (taken as the total energies of the bulk metals). FIG. 4 shows that $\Delta H_f$ becomes more positive with increasing x, implying that incorporation of Zn in pyrite is energetically unfavorable. Furthermore, it can be seen that $E_g$ first increases to ~1.13 eV at x=0.0625 before bowing, falling to 0.46 eV at x=0.5.

Figure 5:
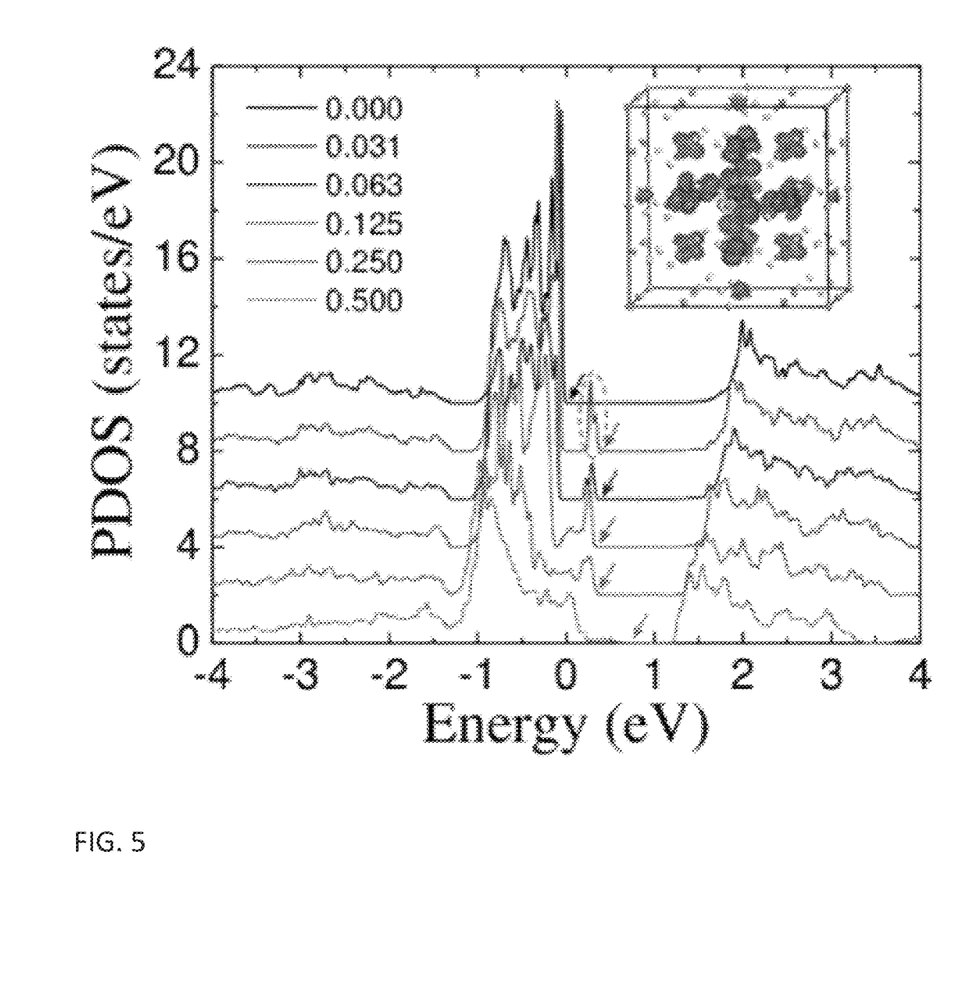
FIG. 5 illustrates partial density of states (PDOS) of the Fe neighbors of the $Zn_{Fe}$ centers in $Fe_{1-x}Zn_xS_2$ alloys.

FIG. 5 illustrates partial density of states (PDOS) of the Fe neighbors of the $Zn_{Fe}$ centers in $Fe_{1-x}Zn_xS_2$ alloys. For x=0.031 (one $Zn_{Fe}$ in a 2×2×2 supercell), $Zn_{Fe}$ induces a gap state centered about 0.3 eV above the valence band maximum (VBM). From the charge density of this gap state in the inset in FIG. 5, it is mainly contributed by Fe atoms adjacent to $Zn_{Fe}$. In addition, this gap state splits from the valence band due to breaking of the local symmetry, so it is occupied by electrons. Measuring $E_g$ as the energy separation between the Fe-$t_{2g}$ and S—S ppσ* bands regardless of the localized gap state indicates the band gap increases slightly due to the expansion of the lattice constant. A similar feature is also observed for x=0.063, but the bandwidth of the gap state is larger than that of x=0.031. As the concentration of $Zn_{Fe}$ further increases, the Zn-induced gap state broadens and finally mixes with the original valence band of pyrite. Consequently, a new valence band forms and the new VBM lies within the gap of bulk pyrite. As a result, $E_g$ significantly decreases for $Fe_{1-x}Zn_xS_2$ alloys with $0.063 < x \leq 0.5$.

Figure 6:
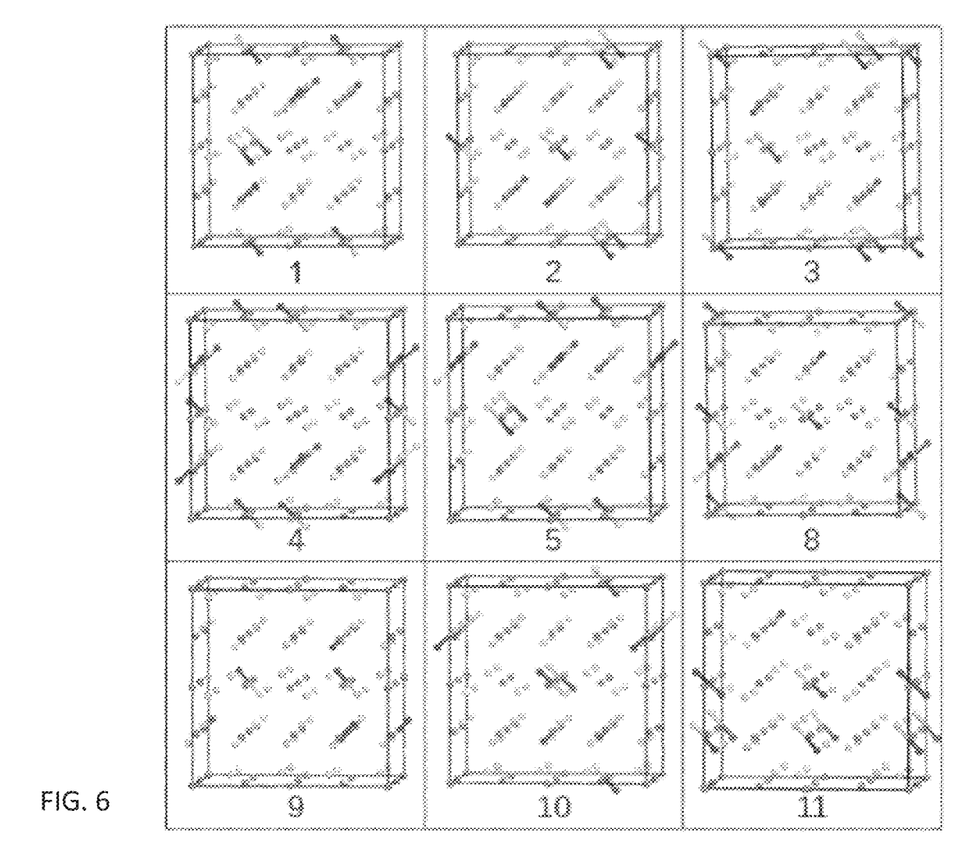
FIG. 6 illustrates atomic structures of $FeS_{1.8125}O_{0.1875}$ alloys in a 2×2×2 supercell.

FIG. 6 illustrates atomic structures of $FeS_{1.8125}O_{0.1875}$ alloys in a 2×2×2 supercell. Numbers label the corresponding structures. Configurations 6 and 7 were also given in FIG. 3.

Figure 7:
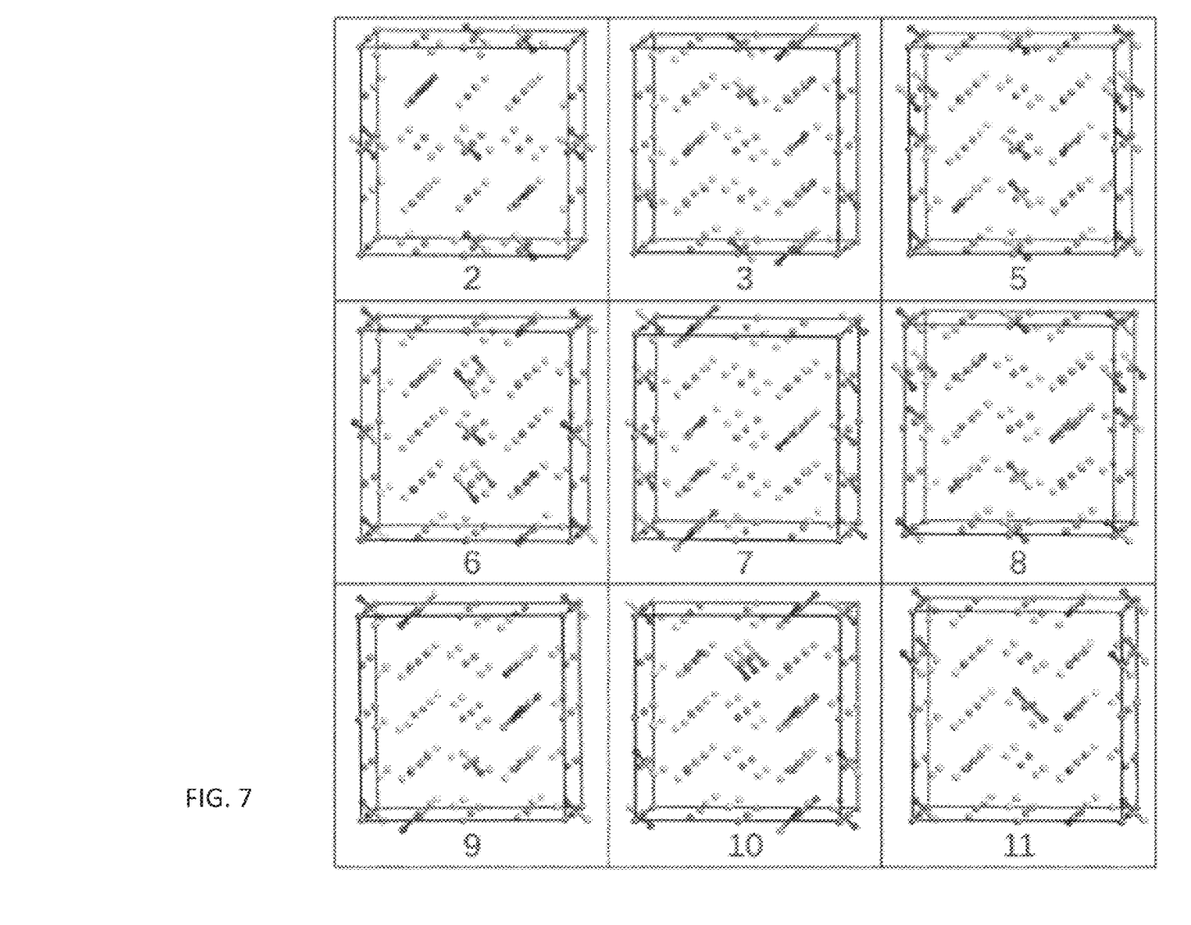
FIG. 7 illustrates atomic structures of $FeS_{1.75}O_{0.25}$ alloys in a 2×2×2 supercell.

FIG. 7 illustrates atomic structures of $FeS_{1.75}O_{0.25}$ alloys in a 2×2×2 supercell. The settings are the same as FIG. 6. Configurations 1 and 4 were also given in FIG. 3.

FIGS. 6 and 7 illustrate a study of atomic configurations of $FeS_{2-x}O_x$ to test the robustness of an increase in $E_g$ against different Os configurations, since a random distribution of Os is expected in real samples. 11 atomic configurations of $FeS_{2-x}O_x$ alloys are depicted in FIGS. 6 and 7, and were generated by randomly replacing 6 sulfur atoms (for x=0.1875, or 9.4% Os) or 8 sulfur atoms (for x=0.25, or 12.5% Os) with oxygen atoms in the 2×2×2 supercell. For both concentrations, Configurations 1-10 contain only S—S and S—O dimers, while Configuration 11 includes one O—O dimer in order to evaluate the likelihood of 0-0 dimerization in pyrite. As shown in FIG. 3B, Configuration 11 has a substantially more positive formation enthalpy than Configurations 1-10 for both Os concentrations, by as much as 1.1 eV per O—O dimer. Therefore, the equilibrium concentration of O—O dimers should be lower than that of O—S dimers by a factor of $10^{13}$-$10^{14}$ at T=400-500 K according to the Boltzmann equation. Furthermore, several of the results in FIG. 3B show that Os centers tend to distribute uniformly in the pyrite lattice. First, the most ordered (uniform) configuration of $FeS_{1.75}O_{0.25}$ (Configuration 1) is more stable than Configurations 2-10 by 0.4-0.8 eV per supercell (or 12-28 meV per formula unit). Second, the less uniform distribution of $FeS_{1.8215}SO_{0.1875}$ (Configuration 7) is ~0.1 eV higher in energy than Configuration 6. Significantly, the band gap is insensitive to the spatial configuration of the O—S dimers when 0-0 dimerization is excluded. $E_g$ is ~1.3 eV for Configurations 2-10 of $FeS_{1.75}O_{0.25}$ and ~1.2 eV for Configurations 1-10 of $FeS_{1.8215}SO_{0.1875}$. This insensitivity of Eg to the O—S configuration increases the chance of synthesizing $FeS_{2-x}O_x$ films with stable band gaps larger than 1.2 eV using appropriate experimental conditions.

For both $FeS_{1.8125}O_{0.1875}$ and $FeS_{1.75}O_{0.25}$ alloys, eleven configurations are considered as shown in FIGS. 6 and 7. For both concentrations, the first ten configurations contain only S—S and S—O dimers, while the 11th configuration includes one O—O dimer in order to test the likelihood of O—O dimerization in pyrite. In all structures, the S—O bond lengths are between 1.72 A and 1.74 A, significantly shorter than the S—S bond length (2.15 A). This effect makes the lattice constants of $FeS_{2-x}O_x$ alloys decrease with increasing x. On the other hand, the O—O bond length in the 11th configuration is as long as 2.50 A, implying that the O—O dimer is strongly unfavorable.

The preceding discussion indicates that substituting oxygen for sulfur is an effective way to increase the band gap of iron pyrite while avoiding gap states and maintaining the favorable electrical and optical properties of pure pyrite. Os alloying at ~10% reduces the width of the sulfur ppσ* band and raises the CBM by 0.2-0.3 eV regardless of the exact spatial distribution of the Os centers. These results show the promise of fabricating pyrite absorber layers with optimum band gaps for photovoltaic applications (1.2-1.3 eV).

Figure 8:
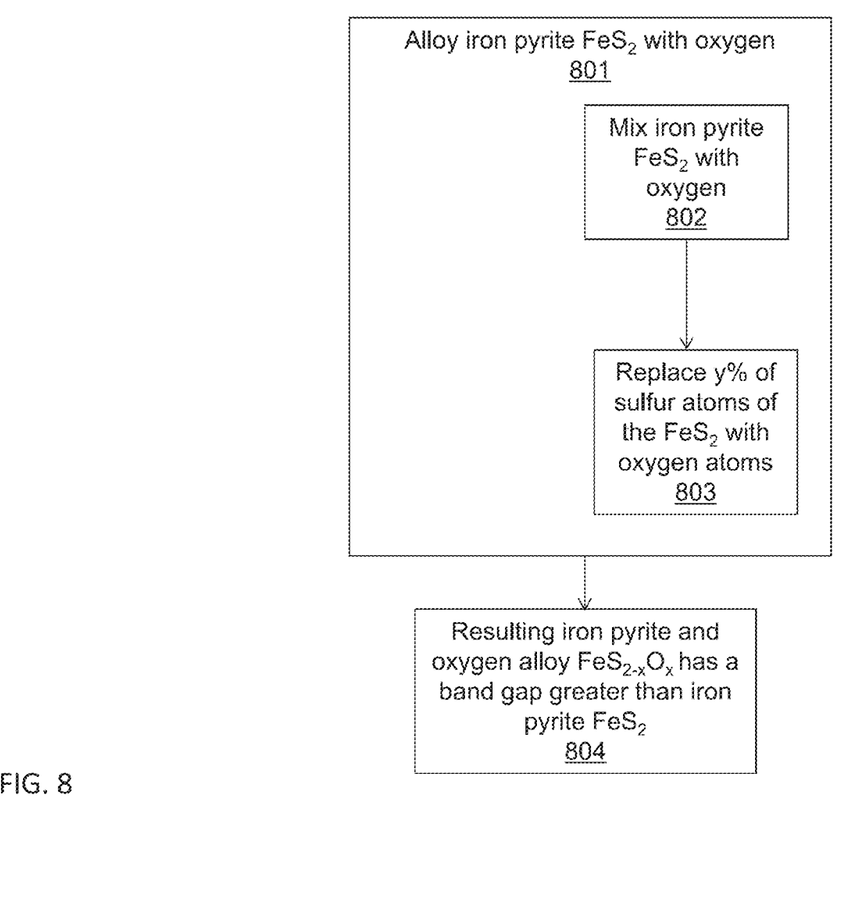
FIG. 8 illustrates a process for use with the present system, according to one embodiment.

FIG. 8 illustrates a process for use with the present system, according to one embodiment. A method for increasing the band gap of iron pyrite ($FeS_2$) comprises alloying iron pyrite ($FeS_2$) with oxygen 801. The alloying can include mixing oxygen with iron pyrite ($FeS_2$) 802 and replacing a certain percentage (10% for example) 803 of the sulfur atoms of the iron pyrite ($FeS_2$) with oxygen atoms. An iron pyrite and oxygen alloy ($FeS_{2-x}O_x$) is formed that has a band gap greater than iron pyrite 804.

Figure 9:
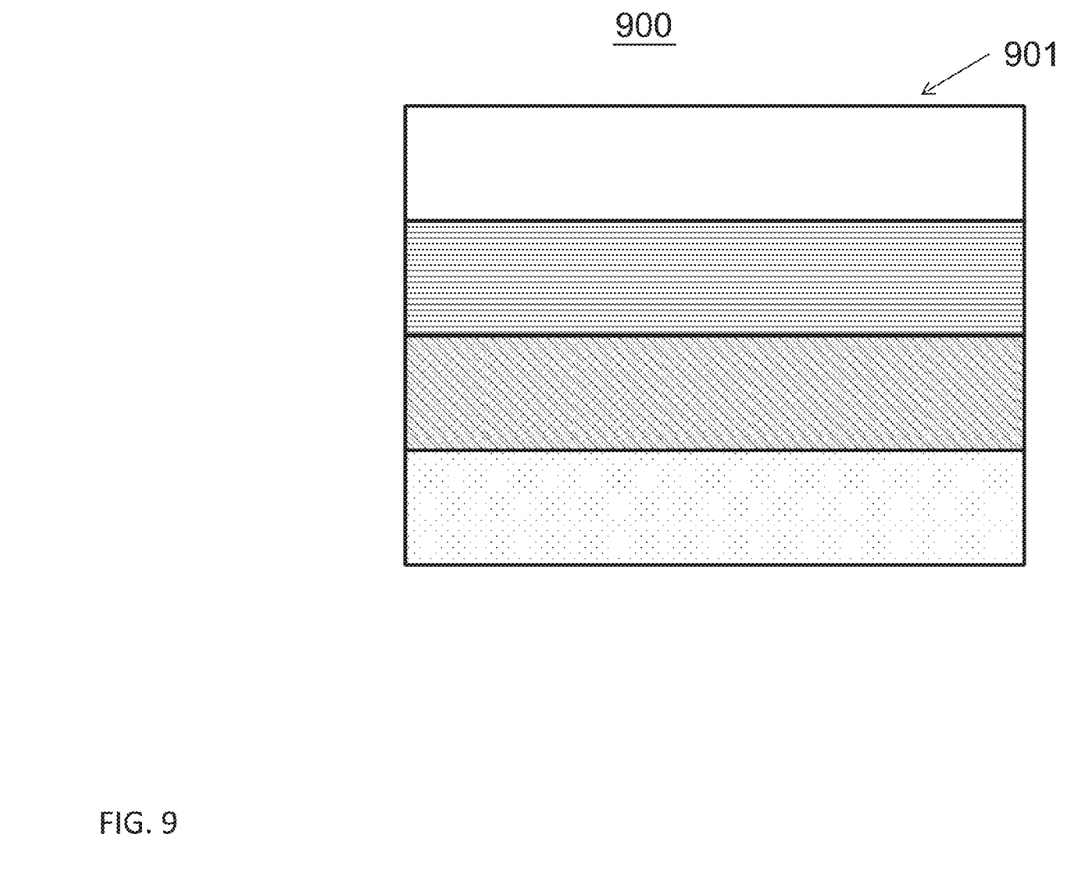
FIG. 9 illustrates an exemplary photovoltaic device for use with the present system, according to one embodiment.

FIG. 9 illustrates an exemplary photovoltaic device for use with the present system, according to one embodiment. An exemplary photo voltaic device 900 comprises one or more absorber layers 901. The one or more absorber layers comprise an iron pyrite based material according to the present disclosure having a band gap greater than iron pyrite (FeS2). The iron pyrite based material is preferably an iron pyrite and oxygen alloy (FeS2-xOx). The iron pyrite and oxygen alloy is preferably formed by replacing about 10% of the sulfur atoms with oxygen atoms. The band gap of the iron pyrite based material is in a range from about 1.2 eV to about 1.5 eV.

While the invention has been described in connection with specific examples and various embodiments, it should be readily understood by those skilled in the art that many modifications and adaptations of the invention described herein are possible without departure from the spirit and scope of the invention as claimed hereinafter.

Thus, it is to be clearly understood that this application is made only by way of example and not as a limitation on the scope of the invention claimed below. The description is intended to cover any variations, uses or adaptation of the invention following, in general, the principles of the invention, and including such departures from the present disclosure as come within the known and customary practice within the art to which the invention pertains.

A method of increasing the band gap of iron pyrite by alloying with oxygen has been disclosed. It is understood that the embodiments described herein are for the purpose of elucidation and should not be considered limiting the subject matter of the disclosure. Various modifications, uses, substitutions, combinations, improvements, methods of productions without departing from the scope or spirit of the present invention would be evident to a person skilled in the art.

What is claimed is:

1. A photo voltaic device, comprising:
   one or more absorber layers, wherein the one or more absorber layers comprise an iron pyrite base material having a band gap greater than iron pyrite (FeS2);
   wherein the iron pyrite based material is an iron pyrite and oxygen alloy ($FeS_{2-x}O_x$); and
   wherein the iron pyrite and oxygen alloy is formed by replacing about 10% of the sulfur atoms with oxygen atoms.

2. The photo voltaic device of claim 1 wherein the band gap of the iron pyrite base material is in a range from about 1.2 eV to about 1.3 eV.

3. A pyrite based photo voltaic material, comprising:
   iron pyrite (FeS2) alloyed with oxygen to form an iron pyrite and oxygen alloy ($FeS_{2-x}O_x$), wherein the iron pyrite and oxygen alloy ($FeS_{2-x}O_x$) having a band gap greater than iron pyrite (FeS2),
   wherein the iron pyrite and oxygen alloy ($FeS_{2-x}O_x$) is formed b replacing about 10% of the sulfur atoms with oxygen atoms.

4. The pyrite based photo voltaic material of claim 3, wherein the band gap of the iron pyrite and oxygen alloy (FeS2-xOx) is in a range from about 1.2 eV to about 1.3 eV.

5. A method for increasing the band gap of iron pyrite (FeS2), comprising:

alloying iron pyrite (FeS2) with oxygen to form an iron pyrite and oxygen alloy ($FeS_{2-x}O_x$) by replacing about 10% of the sulfur atoms of the iron pyrite (FeS2) with oxygen atoms;

wherein the iron pyrite and oxygen alloy ($FeS_{2-x}O_x$) has a band gap greater than iron pyrite (FeS2).

6. The method of claim 5, wherein the step of alloying iron pyrite (FeS2) with oxygen to form the iron pyrite and oxygen alloy further comprises mixing oxygen with iron pyrite (FeS2).

7. The method of claim 5, wherein the band gap of the iron pyrite and oxygen alloy (FeS2-xOx) is in a range from about 1.2 eV to about 1.3 eV.

\* \* \* \* \*